US012340871B2

(12) United States Patent
Chang et al.

(10) Patent No.: US 12,340,871 B2
(45) Date of Patent: Jun. 24, 2025

(54) MEMORY CIRCUITS WITH DYNAMICALLY ADJUSTABLE PULSE WIDTHS AND METHODS FOR OPERATING THE SAME

(71) Applicant: Taiwan Semiconductor Manufacturing Company, Ltd., Hsinchu (TW)

(72) Inventors: Ming-Hung Chang, Hsinchu (TW); Chia-Cheng Chen, Hsinchu (TW); Ching-Wei Wu, Hsinchu (TW); Cheng Hung Lee, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 136 days.

(21) Appl. No.: 18/362,168

(22) Filed: Jul. 31, 2023

(65) Prior Publication Data
US 2024/0355374 A1    Oct. 24, 2024

Related U.S. Application Data

(60) Provisional application No. 63/497,552, filed on Apr. 21, 2023.

(51) Int. Cl.
*G11C 7/22* (2006.01)
*G11C 7/10* (2006.01)
*G11C 7/24* (2006.01)

(52) U.S. Cl.
CPC .............. *G11C 7/222* (2013.01); *G11C 7/109* (2013.01); *G11C 7/24* (2013.01)

(58) Field of Classification Search
CPC ............ G11C 7/222; G11C 7/109; G11C 7/24
See application file for complete search history.

(56) References Cited

U.S. PATENT DOCUMENTS

| 6,055,606 A * | 4/2000 | Sharma | G06F 12/0804 |
| | | | 711/131 |
| 9,697,877 B2 * | 7/2017 | Shanbhag | G11C 8/08 |

(Continued)

FOREIGN PATENT DOCUMENTS

| KR | 10-2002-0080917 A | 10/2002 |
| KR | 10-2018-0053720 A | 5/2018 |

(Continued)

OTHER PUBLICATIONS

Office Action issued in connection with Korean Appl. No. 10-2024-0051323 dated Jan. 13, 2025.

(Continued)

*Primary Examiner* — Son L Mai
(74) *Attorney, Agent, or Firm* — FOLEY & LARDNER LLP (57) ABSTRACT

A circuit includes an array including a plurality of memory cells; a driver operatively coupled to the array and configured to provide an access signal controlling an access to one or more of the plurality of memory cells; and a timing controller operatively coupled to the driver. The timing controller is configured to: receive a control signal; and in response to the control signal transitioning from a first logic state to a second logic state, adjust a pulse width of the access signal within a single clock cycle containing a first phase and a second phase, wherein the first phase includes reading a first data bit stored in a first one of the one or more memory cells and the second phase includes writing a second data bit into the first memory cell.

20 Claims, 10 Drawing Sheets

(56) References Cited

U.S. PATENT DOCUMENTS

| | | | |
|---|---|---|---|
| 10,056,133 B2* | 8/2018 | Baek | G11C 8/08 |
| 2013/0128656 A1 | 5/2013 | Rimondi et al. | |
| 2023/0352082 A1* | 11/2023 | Chesavage | G11C 11/4094 |

FOREIGN PATENT DOCUMENTS

| | | |
|---|---|---|
| TW | 1266313 B | 11/2006 |
| TW | 1689933 B | 4/2020 |

OTHER PUBLICATIONS

Office Action issued in connection with Taiwan Appl. No. 112147102 dated Oct. 17, 2024.

* cited by examiner

MEMORY CIRCUITS WITH DYNAMICALLY ADJUSTABLE PULSE WIDTHS AND METHODS FOR OPERATING THE SAME

CROSS-REFERENCE TO RELATED APPLICATION

This application claims priority to and the benefit of U.S. Provisional Application No. 63/497,552, filed Apr. 21, 2023, entitled "REAL-TIME DYNAMIC PERFORMANCE SCALING ARCHITECTURE FOR HPC SRAM DESIGN," which is incorporated herein by reference in its entirety for all purposes.

BACKGROUND

Developments in electronic devices, such as high-performance computing devices, portable devices, smart phones, internet of thing (IoT) devices, etc., have prompted increased demands for memory devices. In general, memory devices may be volatile memory devices and non-volatile memory devices. Volatile memory devices can store data while power is provided but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Static Random-Access Memory (SRAM) is a type of volatile memory that uses latching circuitry to store each bit. Integrated circuits commonly embed SRAM circuits to provide on-chip data storage. A given instance of an SRAM circuit is typically configured to meet specific design requirements associated with the surrounding circuitry attached to the SRAM. One common type of SRAM circuit provides one port for either read or write access to data stored within the SRAM. The address inputs to such a circuit are typically shared for both read and write access. Another common type of SRAM circuit, referred to as a two-port SRAM, provides two ports for accessing data stored within the SRAM. Two-port SRAM circuits usually restrict all read accesses to one port and all write accesses to the second port. Each port of a two-port SRAM is typically capable of asynchronous, independent access to data stored within the SRAM, allowing the two-port SRAM to be incorporated in a range of different applications with different usage models.

The two-port SRAM allows designers to achieve system performance levels that are generally higher than those possible using only one-port SRAM circuits. However, for a given number of storage bits, existing two-port SRAM circuits require approximately double the area of one-port SRAM circuits. Thus, integrated circuits where instances of SRAM circuits are a significant portion of the overall die area, using two-port SRAM circuits can be an extremely expensive design option. One way to reduce the die area expense associated with using two-port SRAM circuits involves substituting each two-port SRAM circuit with a one-port SRAM circuit that can perform one read operation and one write operation within one clock cycle (sometimes referred to as a "double-pumped SRAM circuit"). As such, adequate read and write bandwidth may be provided.

In accordance with the ever increasingly shrunken size of technology nodes, operation power of the SRAM circuit is typically desired to reduce, e.g., by lowering "Vmin" of the SRAM circuit. The term "Vmin" is generally referred to as the lowest operating voltage of an SRAM circuit. With such a decreasing Vmin, in general, a read margin and write margin of the SRAM circuit decrease accordingly, which in turn forces to widen the pulses of a word line (WL) signal during read and write operations of the SRAM circuit, respectively. As a result, a maximum operating frequency (sometimes referred to as "/max") of the SRAM circuit is disadvantageously impacted. In other words, a trade-off between the major SRAM characteristics, Fmax and Vmin, exits in the existing SRAM circuits. Thus, the existing SRAM circuits have not been entirely satisfactory in certain aspects.

The present disclosure provides various embodiments of an SRAM circuit that has multiple operation modes. Such different operation modes may correspond to respective read and write margins. For example, when configured in a first mode, the disclosed SRAM circuit may operate with smaller read and write margins (e.g., narrower read and write WL pulse widths); and when configured in a second mode, the disclosed SRAM circuit may operate with larger read and write margins (e.g., wider read and write WL pulse widths). In some embodiments, the first mode may correspond to the SRAM circuit operating with a higher frequency and higher supply voltage, while the second mode may correspond to the SRAM circuit operating with a lower frequency and lower supply voltage. Further, in some embodiments, the disclosed SRAM circuit allows switching of the operation modes to occur at any timing, as desired. For example, the SRAM circuit, as disclosed herein, can switch from the second operation mode to the first operation mode in the transition between a read operation and a write operation. As a result, when provided with a varying supply voltage, the operation modes can change accordingly to adjust the read and/or write WL pulse width in real-time. Stated another way, the operation mode of the disclosed SRAM circuit can be dynamically switched to ensure both Vmin reliability in low supply voltage and Fmax performance in high supply voltage.

Figure 1:
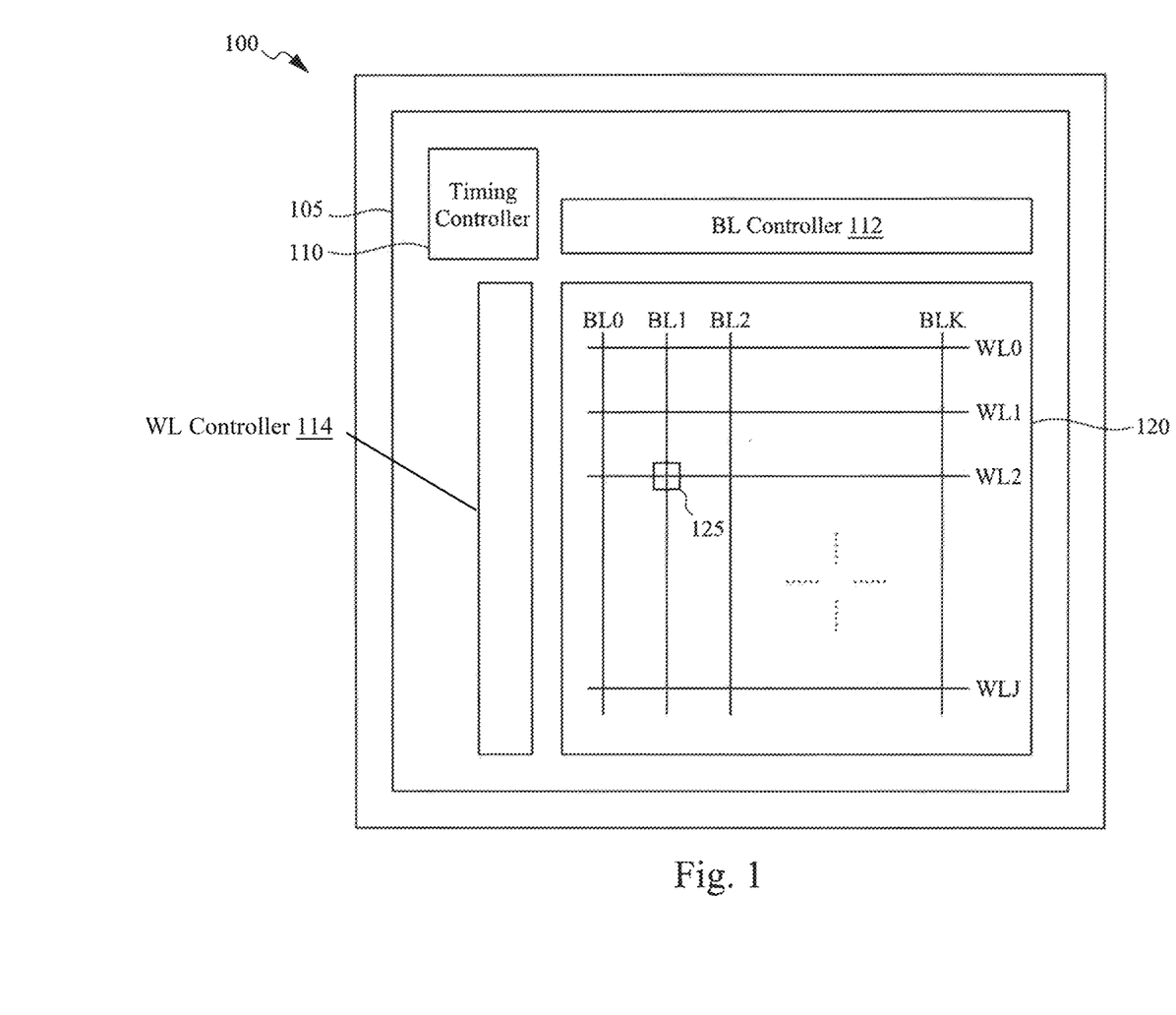
FIG. 1 illustrates an example schematic diagram of a memory system, in accordance with some embodiments.

FIG. 1 illustrates a schematic diagram of a memory system or circuit 100, in accordance with various embodiments. The memory system 100 is implemented as an integrated circuit. As shown in the illustrated example of FIG. 1, the memory system 100 includes a memory controller 105 and a memory array 120. The memory array 120 may include a number of storage circuits, memory cells, memory bits, or bit cells 125 arranged in two-dimensional or three-dimensional arrays. Each of the memory cells 125 may be connected to at least a corresponding word line WL and a corresponding pair of bit lines BL. Each of the word lines WL and bit lines BL may include any conductive (e.g., metal) material. The memory controller 105 may write data to or read data from the memory array 120 according to electrical signals through word lines WL and bit lines BL. In other embodiments, the memory system 100 includes more, fewer, or different components than shown in FIG. 1, while remaining within the scope of the present disclosure.

The memory array 120 is a hardware component that stores data. In one aspect, the memory array 120 is embodied as a semiconductor memory device. The memory array 120 includes a number of storage circuits or memory cells 125. In some embodiments, the memory array 120 includes word lines WL0, WL1 . . . . WLJ, each extending in a first direction and bit lines BL0, BL1 . . . . BLK, each extending in a second direction. The word lines WL and the bit lines BL may be conductive metals or conductive rails. In one aspect, each memory cell 125 is connected to a corresponding word line WL and a corresponding pair of bit lines BL, and can be operated according to voltages or currents through the corresponding word line WL and the corresponding pair of bit lines BL. In one aspect, each memory cell 125 may be a one-port Static Random-Access Memory (SRAM) cell. For example, the memory cell 125 can be implemented as a six-transistor (6T) SRAM cell. However, it should be understood that the memory cell 125 can be implemented as any of various other memory configurations, while remaining within the scope of the present disclosure. In some embodiments, the memory array 120 includes additional lines (e.g., sense lines, reference lines, reference control lines, power rails, etc.).

The memory controller 105 is a hardware component that controls operations of the memory array 120. In some embodiments, the memory controller 105 includes a bit line controller 112, a word line controller 114, and a timing controller 110. In one configuration, the word line controller 114 is a circuit that provides a voltage or current signal through one or more word lines WL of the memory array 120. In one aspect, the bit line controller 112 is a circuit that provides a voltage or current signal through one or more bit lines BL of the memory array 120 and senses a voltage or current from the memory array 120 through the one or more bit lines BL. In one configuration, the timing controller 110 is a circuit that provides control signals or clock signals to the word line controller 114 and the bit line controller 112 to synchronize operations of the bit line controller 112 and the word line controller 114.

The bit line controller 112 may be connected to the bit lines BL of the memory array 120, and the word line controller 114 may be connected to the word lines WL of the memory array 120. In one example, to write data to a memory cell 125, the word line controller 114 is configured to apply a voltage or current signal (sometimes referred to as a WL signal) to the memory cell 125 through a corresponding word line WL connected to the memory cell 125, and the bit line controller 112 is configured to apply a voltage or current signal corresponding to data to be stored to the memory cell 125 through a pair of bit lines BL connected to the memory cell 125. To read data from a memory cell 125, the word line controller 114 is configured to apply a WL signal to the memory cell 125 through a corresponding word line WL connected to the memory cell 125, and the bit line controller 112 is configured to sense a voltage or current corresponding to data stored by the memory cell 125 through a bit line connected to the memory cell 125. In some embodiments, the memory controller 105 includes more, fewer, or different components than shown in FIG. 1, while remaining within the scope of the present disclosure.

According to various embodiments of the present disclosure, the timing controller 110 can adjust a pulse width of the WL signal provided through the word lines WL, based on switching an operation mode configured for the memory system 100 (or the memory array 120). For example, the timing controller 110 can shorten a pulse width of the WL signal applied through a corresponding word line WL to one of the memory cells 125, when the memory cell 125 is configured to switch from a second operation mode to a first operation mode. Later, the timing controller 110 can widen back the pulse width of the WL signal applied through the corresponding word line WL to the memory cell 125, when the memory cell 125 is configured to switch from the first operation mode back to the second operation mode.

Further, the timing controller 110 can adjust the pulse width of a WL signal during any clock cycle, which allows performance of the memory system 100 to vary according to different needs. For example, during one single clock cycle that contains a read operation and a write operation, the timing controller 110 may maintain the pulse width of a first WL signal configured for the read operation (sometimes referred to as a "read WL signal" or "read WL pulse"), and then adjust the pulse width of a second WL signal configured for the write operation (sometimes referred to as a "write WL signal" or "write WL pulse"). Alternatively stated, the memory cell 125 may be configured in the second operation mode when being read, and later switched to the first operation mode when being programmed or written. Continuing with the above example, during a subsequent clock cycle (that contains another read operation and another write operation), the memory cell 125 may be switched to the second operation mode. Upon being configured in the second operation mode, the pulse width of a corresponding WL signal may be widen.

In various embodiments, the first operation mode and the second operation mode may be associated with different read and write margins, which are herein referred to as a turbo mode and a default mode, respectively. In general, the term "read margin" refers to a minimum voltage for a sense amplifier to differentiate the respective voltages present on a pair of bit lines BL; and the term "write margin" refers to a minimum time window for flipping logic states present on a pair of bit lines BL before a WL signal transitions to a logic low (or somewhere between a logic low and logic high). Accordingly, the read margin is typically measured in the units of millivolts (mV), and the write margin is typically measured in the units of picoseconds (pS). The turbo mode may correspond to a smaller read margin and a smaller write margin, while the default mode may correspond to a larger read margin and a larger write margin, according to some embodiments of the present disclosure. As a non-limiting example where Vmin is about 1 V, the read and write margins for the turbo mode are about 30 mV and 15 pS, respectively, and the read and write margins for the default mode are about 38 mV and 30 pS, respectively. As another non-limiting example where Vmin is about 0.9 V, the read and write margins for the turbo mode are about 25 mV and 10 pS, respectively, and the read and write margins for the default mode are about 35 mV and 28 pS, respectively. The timing controller 110 can determine whether to switch the operation mode according to a control signal received through an input/output pin of the memory system 100, which will be discussed in further detail below.

Figure 2:
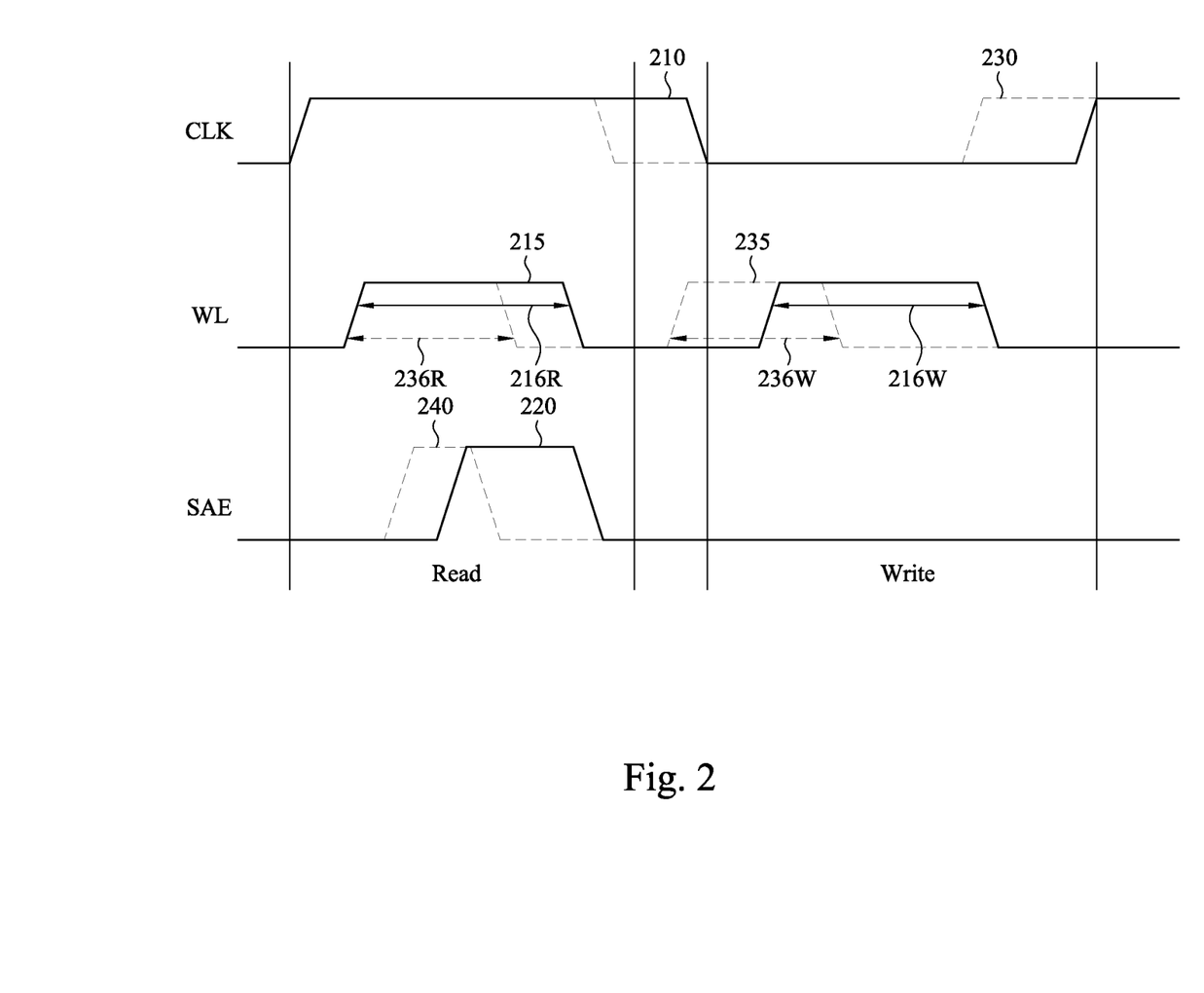
FIG. 2 illustrates example waveforms of signals operating the memory system of FIG. 1 in different modes, in accordance with some embodiments.

FIG. 2 illustrates schematic waveforms of various signals, e.g., a clock (CLK) signal, a word line (WL) signal, and a sense enable (SAE) signal, operating the memory cell 125 (FIG. 1) in the default mode and the turbo mode, respectively, in accordance with various embodiments. It should be understood that the waveforms shown in FIG. 2 are provided for mere illustration purposes, and are not intended to limit the scope of the present disclosure. In the illustrated example of FIG. 2, the memory cell 125 is configured as part of a double-pumped SRAM circuit, i.e., one clock cycle containing one read operation and one write operation. For example, one read operation followed by one write operation may be sequentially performed in each of the clock cycles on the memory cell 125. However, it should be appreciate that the memory cell 125 can be configured in any of various other operation, while remaining within the scope of the present disclosure.

As shown, waveforms 210, 215, and 220 represent the CLK signal, WL signal, and SAE signal, respectively, when the memory cell 125 is configured to operate in the default mode (hereinafter "CLK signal 210," "WL signal 215," and "SAE signal 220"); and waveforms 230, 235, and 240 represent the CLK signal, WL signal, and SAE signal, respectively, when the memory cell 125 is configured to operate in the turbo mode (hereinafter "CLK signal 230," "WL signal 235," and "SAE signal 240"). It should be appreciated that, for comparison purposes, it is intentionally to align respective rising edges of the CLK signal 210 and the CLK signal 230 in the illustrated example of FIG. 2. In reality, the CLK signal 230 may be present prior to or subsequently to the CLK signal 210.

In the default mode, the CLK signal 210 has two phases configured for a read operation and a write operation, respectively. Specifically, during the read operation of the CLK signal 210, the WL signal 215 has a first pulse with a pulse width 216R, with the SAE signal 220 having a pulse; and during the write operation of the CLK signal 210, the WL signal 215 has a second pulse with a pulse width 216W, with the SAE signal 220 kept at logic low. In the turbo mode, the CLK signal 230 may have a shorter period (i.e., a higher frequency) when compared to the CLK signal 210. Accordingly, during a read operation of the CLK signal 230, the WL signal 235 has a first pulse with a shorten pulse width 236R (when compared to the pulse width 216R), with the SAE signal 240 also presenting a shorten pulse width; and, during a write operation of the CLK signal 230, the WL signal 235 has a second pulse with a shorten pulse width 236W (when compared to the pulse width 216W).

With the shorten WL pulse width, the corresponding read/write margin may shrink. However, the shorten WL pulse width generally lead to a significantly increased Fmax. As the disclosed memory system can switch between the turbo mode and the default mode at any desired timing (e.g., without configuring additional clock cycle to perform the switch), the disclosed memory system can be dynamically configured to operate in a suitable mode in accordance with varying operating conditions. For example, when a supply voltage is configured higher for the memory system, the memory system may operate under the turbo mode, with higher/max but a smaller read/write margin (which is acceptable as the margin is increased along with the higher supply voltage). When the supply voltage of the memory system is configured lower, the memory system may switch to the default mode, with a larger read/write margin.

As described above, the timing controller 110 (FIG. 1) can determine whether to switch the operation mode according to a control signal received through an input/output pin of the memory system 100. In one embodiment of the present disclosure, the memory system 100 may have one of its input/output pins configured to receive a control signal that causes the timing controller 110 to adjust the pulse width of a read and/or write WL signal. Such a control signal is hereinafter referred to as "TURBO control signal." For example, when the TURBO control signal is asserted to logic high, the memory system 100 is in the turbo mode (e.g., causing the timing controller 110 to shorten the pulse width); and when the TURBO control signal is asserted to logic low, the memory system 100 is in the default mode (e.g., causing the timing controller 110 to widen the pulse width). In another embodiment of the present disclosure, the memory system 100 may have two of its input/output pins configured to receive a first control signal and a second control signal that cause the timing controller 110 to adjust the pulse width of a read and/or write WL signal. Such a first control signal and a second control signal are hereinafter referred to as "TURBO control signal" and "low voltage (LV) control signal," respectively. For example, when the TURBO control signal is asserted to logic high and the LV control signal is also asserted to logic high, the memory system 100 is in the turbo mode (e.g., causing the timing controller 110 to shorten the pulse width); when the TURBO control signal is asserted to logic high and the LV control signal is asserted to logic low, the memory system 100 is in a super turbo mode (e.g., causing the timing controller 110 to further shorten the pulse width); when the TURBO control signal is asserted to logic low and the LV control signal is also asserted to logic low, the memory system 100 is in the default mode (e.g., causing the timing controller 110 to widen the pulse width); and when the TURBO control signal is asserted to logic low and the LV control signal is asserted to logic high, the memory system 100 is in a low voltage mode (e.g., causing the timing controller 110 to further widen the pulse width).

Figure 3:
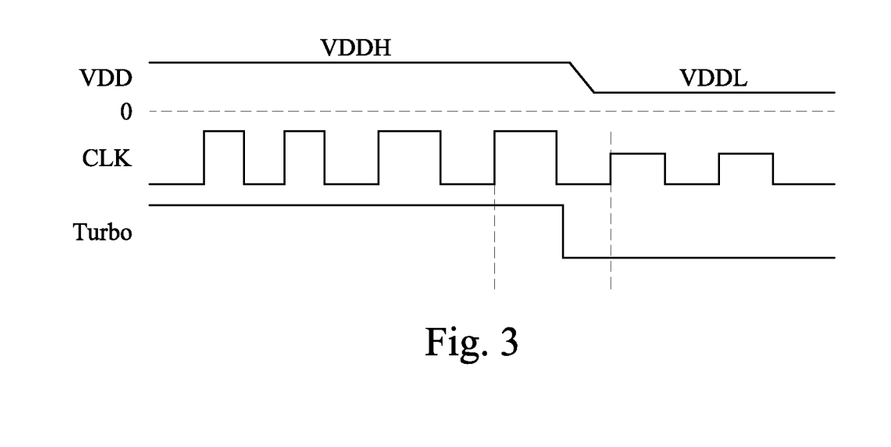
FIG. 3 illustrates example waveforms of signals operating the memory system of FIG. 1 in different modes, in accordance with some embodiments.
Figure 4:
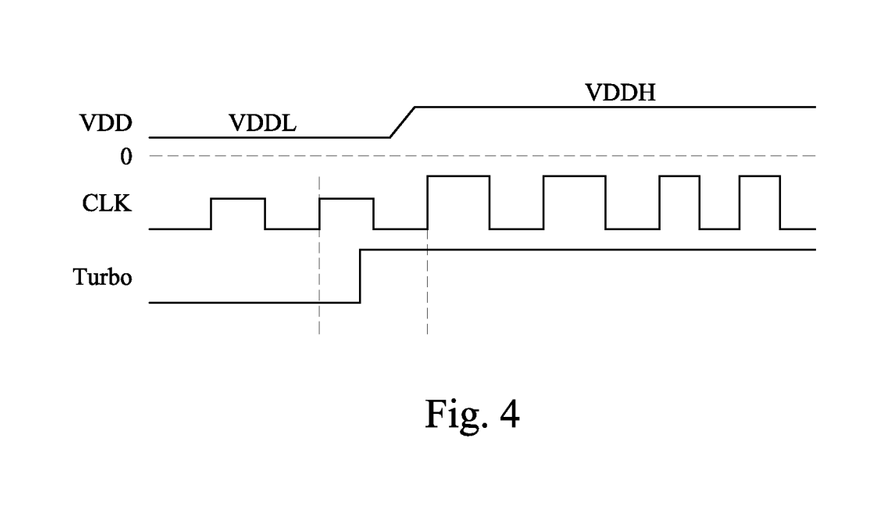
FIG. 4 illustrates example waveforms of signals operating the memory system of FIG. 1 in different modes, in accordance with some embodiments.

FIGS. 3 and 4 further illustrate schematic waveforms of various signals, e.g., a supply voltage (VDD), the CLK signal, and the turbo control signal, operating the memory cell 125 (FIG. 1) in the default mode and the turbo mode, respectively, in accordance with various embodiments.

As shown in FIG. 3, when the TURBO control signal transitions from logic high to logic low, the memory cell 125 transitions from the turbo mode to the default mode. Specifically, the supply voltage VDD may transition from a higher level (VDDH) to a lower level (VDDL), and the CLK signal may also transition from a higher frequency to a lower frequency. In some embodiments, the frequency of the CLK signal may be reduced, prior to lowering the level of the supply voltage. In FIG. 4, when the TURBO control signal transitions from logic low to logic high, the memory cell 125 transitions from the default mode to the turbo mode. Specifically, the supply voltage VDD may transition from a lower level (VDDL) to a higher level (VDDH), and the CLK signal may also transition from a lower frequency to a higher frequency. In some embodiments, the frequency of the CLK signal may be increased, subsequently to increasing the level of the supply voltage.

Figure 5:
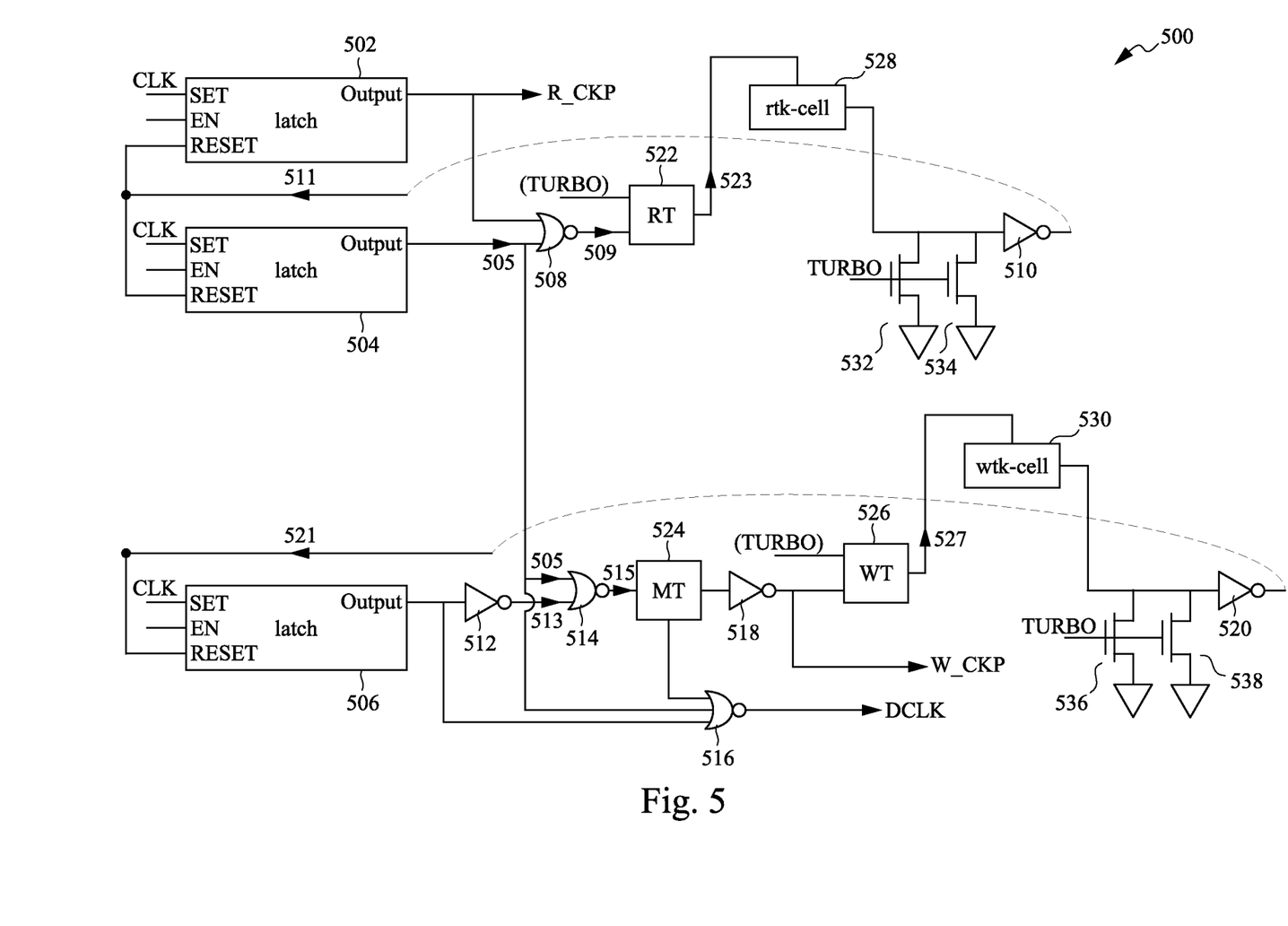
FIG. 5 illustrates an example circuit diagram of a timing controller of the memory system of FIG. 1 in different modes, in accordance with some embodiments.

FIG. 5 illustrates an example circuit diagram of a portion 500 of the timing controller 110 (hereinafter "timing controller 500"), in accordance with various embodiments. The timing controller 500 is configured to adjust the pulse width of a WL signal based on the coupled memory cell (e.g., 125) switching between the turbo mode and the default mode. As a brief overview, the timing controller 500 can change a timing of a falling edge of the read and/or write WL signal based on a logic state of the TURBO control signal received. Operation of the timing controller 500 will be discussed in further detail below, in conjunction with one or more of the preceding figures (e.g., FIG. 2). It should be understood that the circuit diagram 500 is simplified, and thus, the timing controller 500 can include other components while remaining within the scope of the present disclosure.

As shown, the timing controller 500 includes latches 502, 504, and 506, logic gates 508, 510, 512, 514, 516, 518, and 520, delay circuits 522, 524, and 526, tracking cells 528 and 530, and transistors 532, 534, 536, and 538. In some embodiments, the latches 502 to 506 are each implemented as a Set-Reset (S-R) latch that includes at least two input terminals, "SET" and "RESET," and one output terminal, "OUTPUT." The S-R latch is one type of bistable multivibrators having two stable states, where the S-R latch is configured to set its OUTPUT (to logic high) when the input signals received from the SET and RESET are at logic high and logic low, respectively; and reset its OUTPUT (to logic low) when the input signals received from the SET and RESET are at logic low and logic high, respectively. It should be appreciated that the latches 502 to 506 may be implemented as other type of latches or other combination of logic gates to achieve similar functions, while remaining within the scope of the present disclosure.

For example, the latch 502 receives a clock signal (e.g., the CLK signal mentioned above with respect to FIG. 2) through its SET, receives a feedback signal 511 (which will be discussed below) through its RESET, and provides a signal "R_CKP" at its OUTPUT; the latch 504 receives the same clock signal through its SET, receives the same feedback signal through its RESET, and provides a signal 505 at its OUTPUT; and the latch 506 receives the same clock signal through its SET, receives another feedback signal 521 (which will be discussed below) through its RESET, and provides a signal "W_CKP" at its OUTPUT. In various embodiments of the present disclosure, the R_CKP signal and W_CKP signal may correspond to the read WL signal (the first pulse of the WL signal 215/235 shown in FIG. 2) and the write WL signal (the second pulse of the WL signal 215/235 shown in FIG. 2), respectively.

In various embodiments, the CLK signal (e.g., received from a clock generation circuit) generally toggles between logic high and logic low with a certain frequency. The latches 502 to 506 may be driven by the same CLK signal. The latch 504 may be always activated or enabled regardless of a read operation or write operation. Further, during the read operation, the latch 502 is activated or enabled, with the latch 506 being deactivated or disabled; and during the write operation, the latch 502 is deactivated or disabled, with the latch 506 being activated or enabled. The operatively coupled memory cell 125 may first being read then written. During each of the read and write operation, the timing controller 500 can selectively adjust a pulse width of the corresponding WL signal based on the TURBO control signal, which will be discussed as follows.

During the read operation (or along a read path), in response to the CLK signal transitioning from logic low to logic high, the latch 502, with the feedback signal 511 initially remaining at logic low, can pull up the R_CKP signal to logic high (i.e., a rising edge of the read WL signal in FIG. 2). Next, the R_CKP signal (at logic high), together with the signal 505 (which is output at logic high), are provided to the logic gate 508 implemented as a NOR gate. The NOR gate 508 then outputs a signal 509 at logic low. The delay circuit 522 can receive this logic low signal 509, which, in some embodiments, may be a logic inverse of the R_CKP signal. As will be discussed below in FIG. 7, the delay circuit 522 can adjust a delayed amount of the signal 509 (the logic inverse of the R_CKP signal) based on a logic state of the TURBO control signal and logically inverse it, which is thus at logic high. Such a logic high signal 523 can turn on the tracking cell 528 that is configured to mimic, simulate, or otherwise track a read operation of the memory cell 125. For example, the tracking cell 528 can track the discharging rate of a bit line BL to which the memory cell 125 is connected. The tracking cell 528 may have its bit line BL (sometimes referred to as a tracking bit line BL that tracks the discharging rate of the "real" bit line connected to the memory cell 125) connected to the logic gate 510 implemented as an inverter. When the tracking bit line BL is discharged to ground, the logic gate 510 can then output the feedback signal 511 at logic high, which can reset the R_CKP signal to logic low (i.e., a falling edge of the read WL signal in FIG. 2).

In accordance with various embodiments of the present disclosure, the transistors 532 and 534, that are gated by the turbo control signal, can be turned on if the TURBO control signal is asserted to logic high (i.e., the turbo mode). When being turned on, the tracking bit line BL to which the tracking cell 528 is connected can be faster pulled to ground. As a result, the R_CKP signal may transition to logic low faster or earlier, when compared to the case where the transistors 532 and 534 are turned off (i.e., the default mode). Alternatively stated, the falling edge of the read WL signal (FIG. 2) can be adjusted to occur earlier, just like the first pulse of the WL signal 235.

During the write operation (or along a write path), in response to the CLK signal transitioning from logic high to logic low, the latch 506, with the feedback signal 521 initially remaining at logic low, can latch its output signal at logic high. Next, the output signal is logically inversed by the logic gate 512, which is an inverter, to logic low. Such a logic low signal 513, together with the signal 505 (which is output at logic high), are provided to the logic gate 514 implemented as a NOR gate. The NOR gate 514 can outputs a logic low signal 515. The delay circuit 524 can receive and delay this logic low signal 515, and provide it to the logic gate 518, which is an inverter. The inverter 518 can thus provide the W_CKP signal at or to logic high (i.e., a rising edge of the write WL signal in FIG. 2). The delay circuit 526 also receives the W_CKP signal. As will be discussed below in FIG. 8, the delay circuit 526 can adjust a delayed amount of the W_CKP signal, which is at logic high, based on a logic state of the turbo control signal. Such a logic high signal 527 (e.g., a selectively delayed W_CKP signal) can turn on the tracking cell 530. The tracking cell 530 is configured to mimic a write operation of the memory cell 125. For example, the tracking cell 530 can track the voltage present on a bit line BL to which the memory cell 125 is connected. The tracking cell 530 may have its bit line BL (sometimes referred to as a tracking bit line BL that tracks the voltage of the "real" bit line connected to the memory cell 125) connected to the logic gate 520 implemented as an inverter. When the tracking bit line BL is discharged to ground, the logic gate 520 can then output the feedback signal 521 at logic high, which can reset the W_CKP signal to logic low (i.e., a falling edge of the write WL signal in FIG. 2).

Similarly, the transistors 536 and 538, that are gated by the TURBO control signal, can be turned on if the TURBO control signal is asserted to logic high (i.e., the turbo mode). When being turned on, the tracking bit line BL to which the tracking cell 530 is connected can be faster pulled to ground. As a result, the W_CKP signal may transition to logic low faster or earlier, when compared to the case where the transistors 536 and 538 are turned off (i.e., the default mode). Alternatively stated, the falling edge of the write WL signal (FIG. 2) can be adjusted to occur earlier, just like the second pulse of the WL signal 235.

Figure 6:
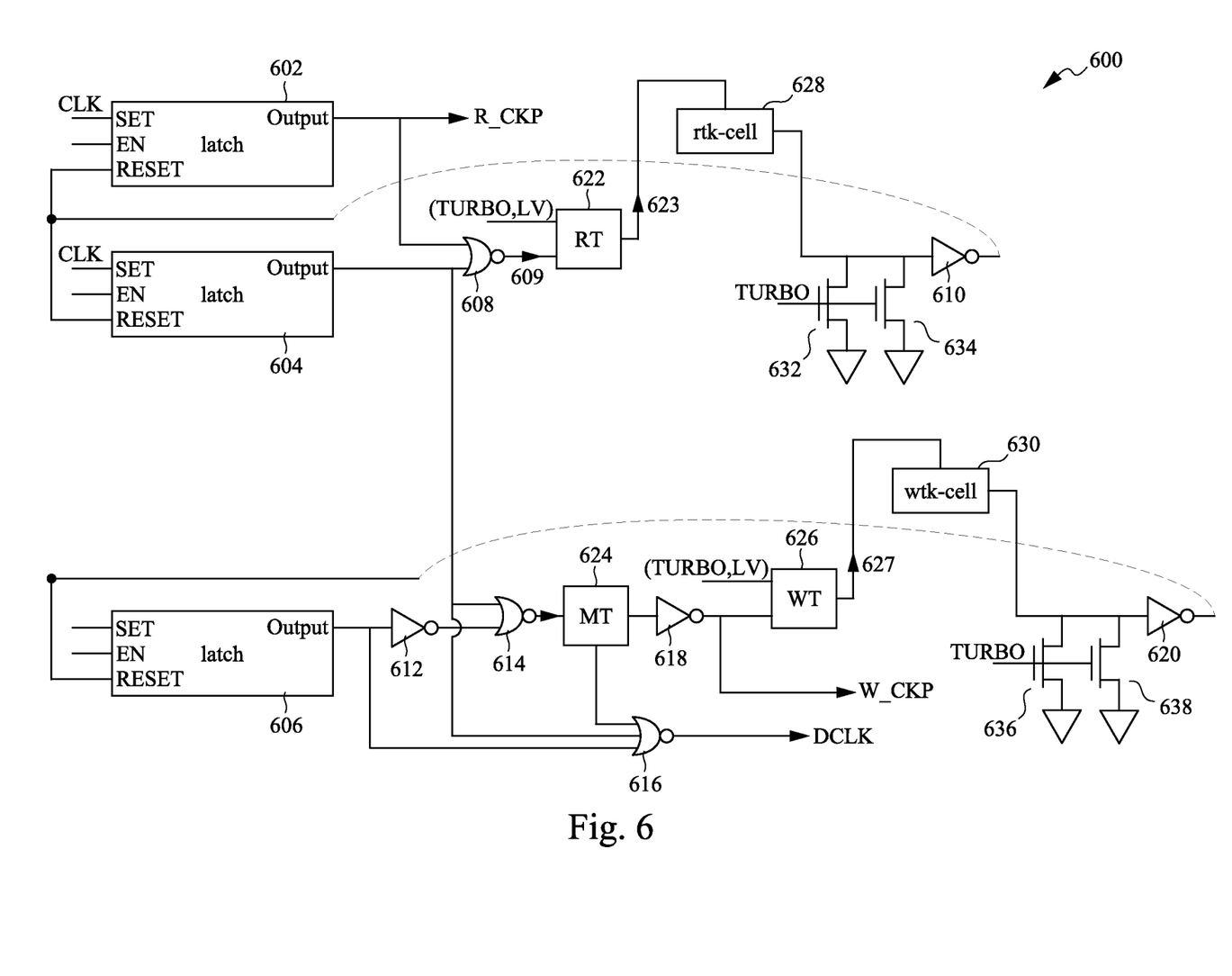
FIG. 6 illustrates an example circuit diagram of a timing controller of the memory system of FIG. 1 in different modes, in accordance with some embodiments.

FIG. 6 illustrates another example circuit diagram of a portion 600 of the timing controller 110 (hereinafter "timing controller 600"), in accordance with various embodiments. The timing controller 600 is configured to adjust the pulse width of a WL signal based on switching among the super turbo mode, the turbo mode, the default mode, and the low voltage mode. As a brief overview, the timing controller 600 can change a timing of a falling edge of the read and/or write WL signal based on a combination of logic states of the TURBO control signal and the LV signal received. It should be understood that the circuit diagram 600 is simplified, and thus, the timing controller 600 can include other components while remaining within the scope of the present disclosure.

In some embodiments, the timing controller 600 is substantially similar to the timing controller 500 (FIG. 5) except that delay circuit 622 and delay circuit 626 of the timing controller 600 are each configured to receive the TURBO control signal and LV control signal. The delay circuit 622 and delay circuit 626 will be discussed in further detail below with respect to FIGS. 9 and 10. Thus, the following discussion regarding other components of the timing controller 600 will be briefly described. The timing controller 600 also includes latches 602, 604, and 606, logic gates 608, 610, 612, 614, 616, 618, and 620, delay circuits 622, 624, and 626, tracking cells 628 and 630, and transistors 632, 634, 636, and 638.

Figure 7:
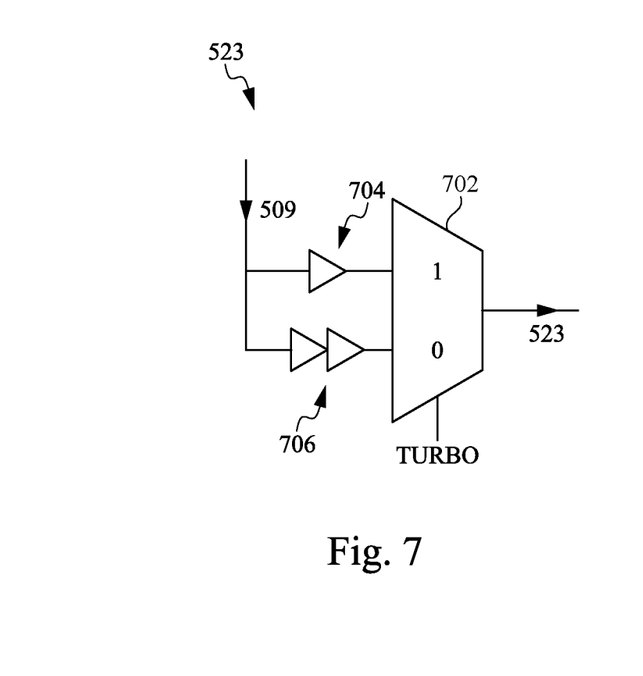
FIGS. 7 and 8 illustrate example circuit diagrams of delay circuits of the timing controller of FIG. 5, in accordance with some embodiments.
Figure 8:
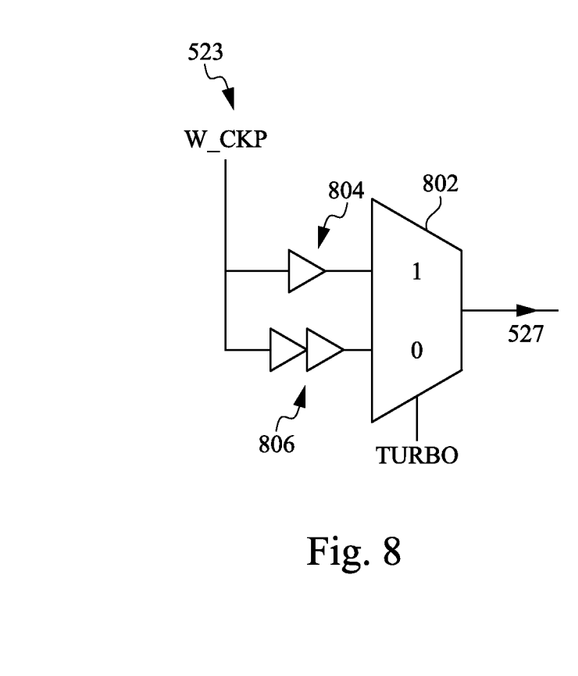

FIGS. 7 and 8 illustrate example circuit diagrams of the delay circuits 522 and 526 shown in FIG. 5, respectively, in accordance with various embodiments. Some of the reference numerals of FIG. 5 may be used again in the following discussion of FIGS. 7 and 8. The delay circuits 522 and 526 are simplified for illustration purposes, and thus, each of the delay circuits 522 and 526 can include or be implemented as any other components, while remaining within the scope of the present disclosure.

Referring first FIG. 7, the delay circuit 522 may include a multiplexer 702 controlled by the TURBO control signal and including at least two inputs and one output. The multiplexer 702 may selectively receive the signal 509 through a first number of buffers 704, and selectively receive the signal 509 through a second number of buffers 706. In some embodiments, the first number is different from the second number. Although one buffer 704 and two buffers 706 are shown in FIG. 7, the numbers of buffers 704 and 706 can be otherwise configured (as long as they are different). For example, the multiplexer 702 may receive the signal 509 through the buffer(s) 704 when the TURBO control signal is asserted to logic high (i.e., the turbo mode), and receive the signal 509 through the buffer(s) 706 when the TURBO control signal is asserted to logic low (i.e., the default mode). In some embodiments, the multiplexer 702 may have a built-in inverter (not shown) to logically inverse (and selectively delay) the signal 509 as the signal 523.

Referring next FIG. 8, the delay circuit 526 may include a multiplexer 802 controlled by the TURBO control signal and including at least two inputs and one output. The multiplexer 802 may selectively receive the W_CKP signal through a first number of buffers 804, and selectively receive the W_CKP signal through a second number of buffers 806. In some embodiments, the first number is different from the second number. Although one buffer 804 and two buffers 806 are shown in FIG. 8, the numbers of buffers 804 and 806 can be otherwise configured (as long as they are different). For example, the multiplexer 802 may receive the W_CKP signal through the buffer(s) 804 when the TURBO control signal is asserted to logic high (i.e., the turbo mode), and receive the W_CKP signal through the buffer(s) 806 when the TURBO control signal is asserted to logic low (i.e., the default mode). In some embodiments, the multiplexer 802 may pass (and selectively delay) the W_CKP signal as the signal 527.

Figure 9:
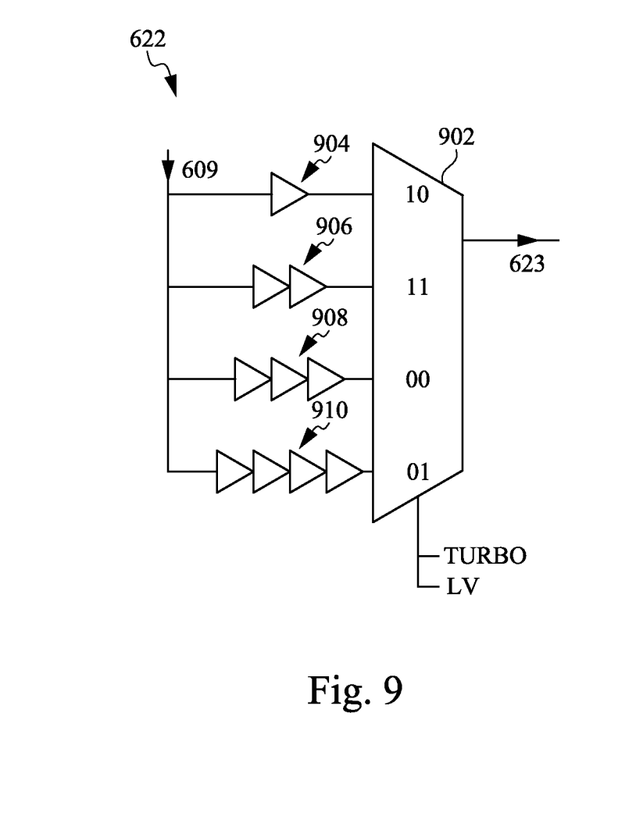
FIGS. 9 and 10 illustrate example circuit diagrams of delay circuits of the timing controller of FIG. 6, in accordance with some embodiments.
Figure 10:
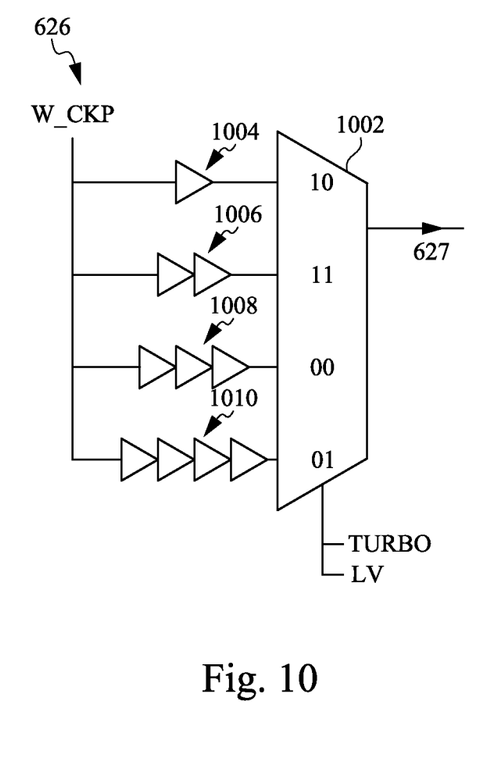

FIGS. 9 and 10 illustrate example circuit diagrams of the delay circuits 622 and 626 shown in FIG. 6, respectively, in accordance with various embodiments. Some of the reference numerals of FIG. 6 may be used again in the following discussion of FIGS. 9 and 10. The delay circuits 622 and 626 are simplified for illustration purposes, and thus, each of the delay circuits 622 and 626 can include or be implemented as any other components, while remaining within the scope of the present disclosure.

Referring first FIG. 9, the delay circuit 622 may include a multiplexer 902 controlled by the TURBO control signal and the LV control signal, and including at least four inputs and one output. The multiplexer 902 may selectively receive the signal 609 through a first number of buffers 904, selectively receive the signal 609 through a second number of buffers 906, selectively receive the signal 609 through a third number of buffers 908, and selectively receive the signal 609 through a fourth number of buffers 910. In some embodiments, the first to fourth numbers are different from each other. Although one buffer 904, two buffers 906, three buffers 908, and four buffers 910 are shown in FIG. 9, the numbers of buffers 904 to 910 can be otherwise configured (as long as they are different). For example, the multiplexer 902 may receive the signal 609 through the buffer(s) 904 when the TURBO and LV control signals are asserted to logic high and logic low, respectively (i.e., the super turbo mode), receive the signal 609 through the buffer(s) 906 when the TURBO and LV control signals are both asserted to logic high (i.e., the turbo mode), receive the signal 609 through the buffer(s) 908 when the TURBO and LV control signals are both asserted to logic low (i.e., the default mode), and receive the signal 609 through the buffer(s) 910 when the TURBO and LV control signals are asserted to logic low and logic high, respectively (i.e., the low voltage mode). In some embodiments, the multiplexer 902 may have a built-in inverter (not shown) to logically inverse (and selectively delay) the signal 609 as the signal 623.

Referring next FIG. 10, the delay circuit 626 may include a multiplexer 1002 controlled by the TURBO control signal and the LV control signal, and including at least four inputs and one output. The multiplexer 1002 may selectively receive the W_CKP signal through a first number of buffers 1004, selectively receive the W_CKP signal through a second number of buffers 1006, selectively receive the W_CKP signal through a third number of buffers 1008, and selectively receive the W_CKP signal through a fourth number of buffers 1010. In some embodiments, the first to fourth numbers are different from each other. Although one buffer 1004, two buffers 1006, three buffers 1008, and four buffers 1010 are shown in FIG. 10, the numbers of buffers 1004 to 1010 can be otherwise configured (as long as they are different). For example, the multiplexer 1002 may receive the W_CKP signal through the buffer(s) 1004 when the TURBO and LV control signals are asserted to logic high and logic low, respectively (i.e., the super turbo mode), receive the W_CKP signal through the buffer(s) 1006 when the TURBO and LV control signals are both asserted to logic high (i.e., the turbo mode), receive the W_CKP signal through the buffer(s) 1008 when the TURBO and LV control signals are both asserted to logic low (i.e., the default mode), and receive the W_CKP signal through the buffer(s) 1010 when the TURBO and LV control signals are asserted to logic low and logic high, respectively (i.e., the low voltage mode). In some embodiments, the multiplexer 1002 may pass (and selectively delay) the W_CKP signal as the signal 627.

Figure 11:
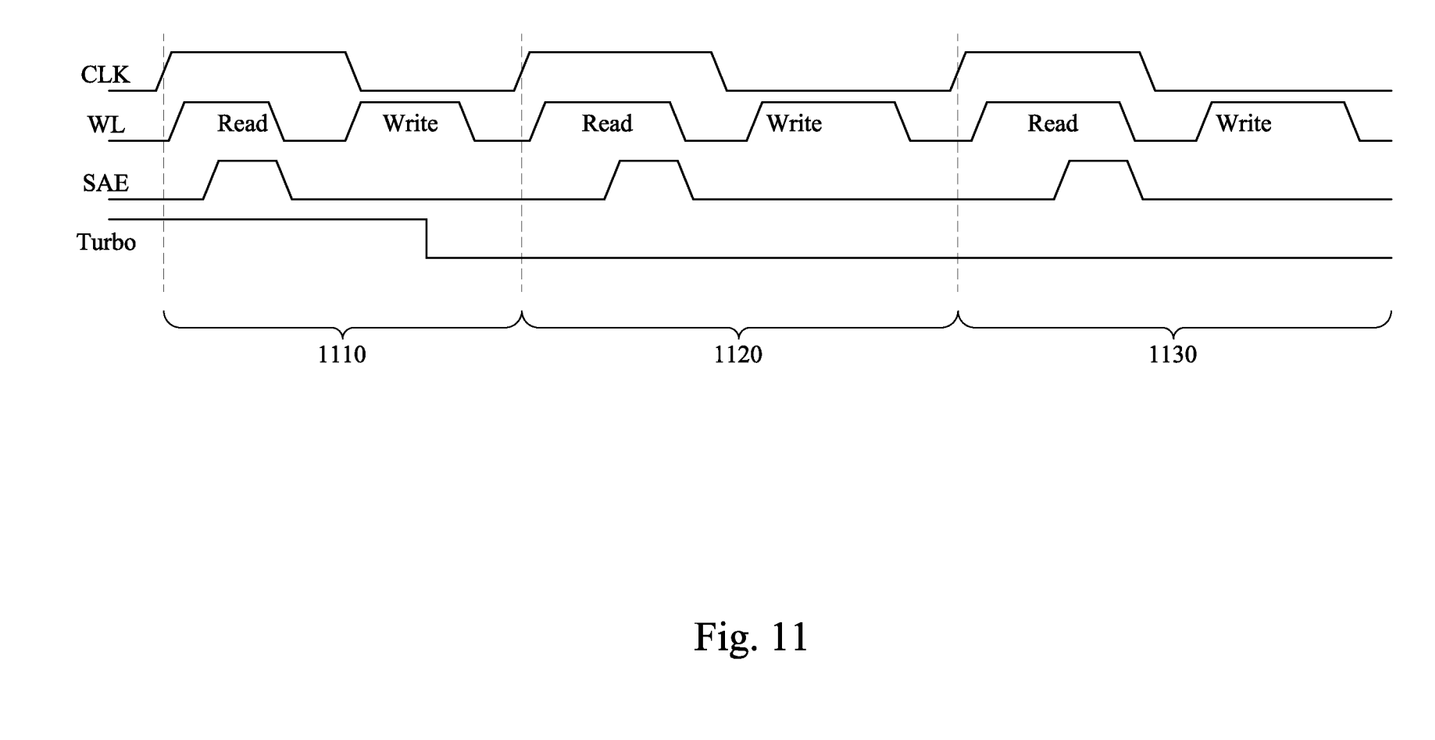
FIG. 11 illustrates example waveforms of signals operating the memory system of FIG. 1 in different modes, in accordance with some embodiments.

FIG. 11 illustrates schematic waveforms of the CLK signal, the WL signal, and the SAE signal, respectively, including a transition of the coupled memory cell 125 from the turbo mode to the default mode, in accordance with various embodiments. It should be understood that the waveforms shown in FIG. 11 are provided for mere illustration purposes, and are not intended to limit the scope of the present disclosure. Similar to the illustrated example of FIG. 2, the memory cell 125 is configured as part of a double-pumped SRAM circuit, i.e., one clock cycle containing one read operation and one write operation. However, it should be appreciate that the memory cell 125 can be configured in any of various other operation, while remaining within the scope of the present disclosure.

As shown, three clock cycles 1110, 1120, and 1130 are sequentially arranged over time. During the first clock cycle 1110, the TURBO control signal is asserted to logic high, and thus, the memory cell 125 is configured to operate under the turbo mode. Further, within the first clock cycle 1110 (e.g., after the write operation in the first clock cycle 1110 is finished), the TURBO control signal transitions from logic high to logic low, causing the memory cell 125 to operate under the default mode. Accordingly, respective pulse widths of the read WL signal and write WL signal in the second clock cycle 1120 and third clock cycle 1130 are widen, when compared to the pulse widths of the read WL signal and write WL signal in the first clock cycle 1110.

Figure 12:
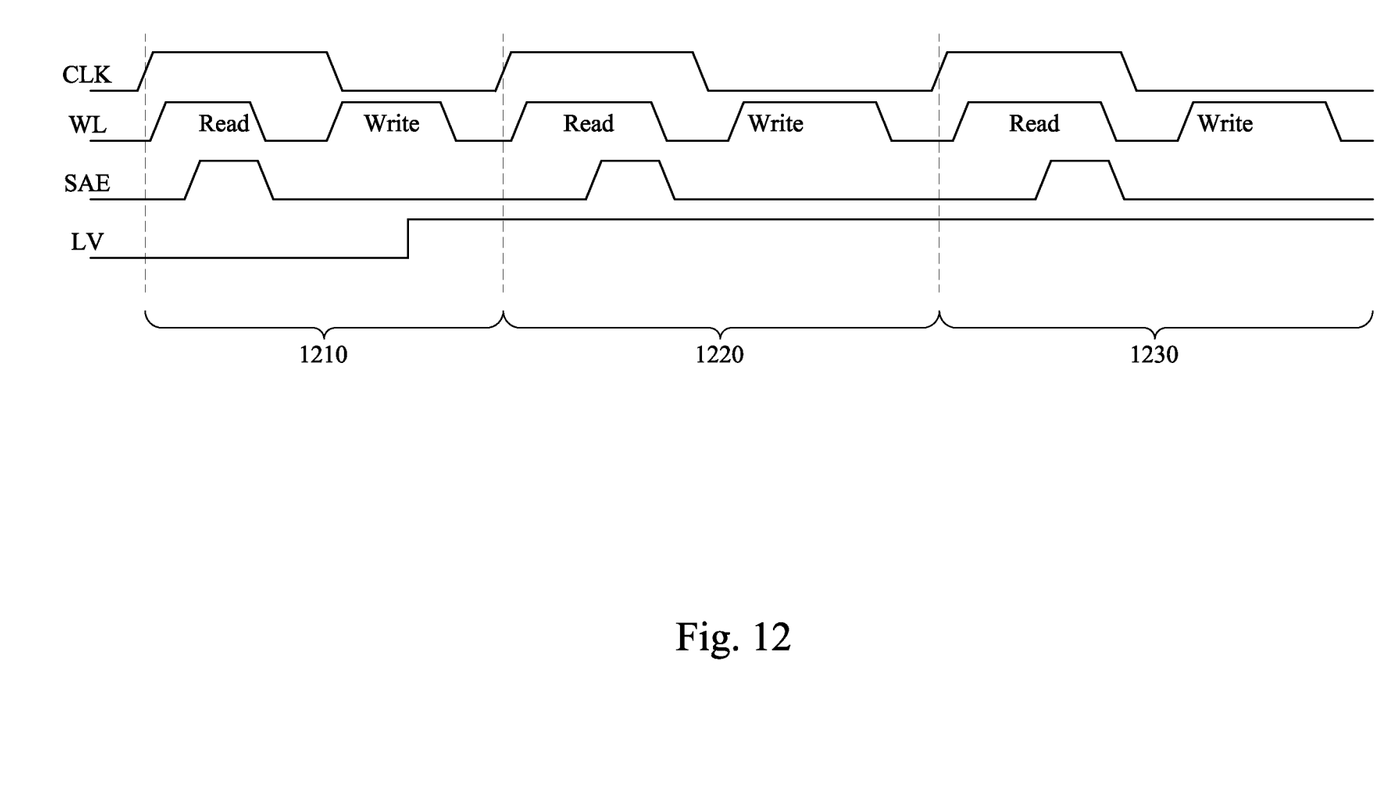
FIG. 12 illustrates example waveforms of signals operating the memory system of FIG. 1 in different modes, in accordance with some embodiments.

FIG. 12 illustrates schematic waveforms of the CLK signal, the WL signal, and the SAE signal, respectively, including a transition of the coupled memory cell 125 from the default mode to the low voltage mode, in accordance with various embodiments. It should be understood that the waveforms shown in FIG. 12 are provided for mere illustration purposes, and are not intended to limit the scope of the present disclosure. Similar to the illustrated example of FIG. 2, the memory cell 125 is configured as part of a double-pumped SRAM circuit, i.e., one clock cycle containing one read operation and one write operation. However, it should be appreciate that the memory cell 125 can be configured in any of various other operation, while remaining within the scope of the present disclosure.

As shown, three clock cycles 1210, 1220, and 1230 are sequentially arranged over time. During the first clock cycle 1210, the LV control signal is asserted to logic low, and thus, the memory cell 125 may be configured to operate under the default mode. Further, within the first clock cycle 1210 (e.g., after the write operation in the first clock cycle 1210 is finished), the LV control signal transitions from logic low to logic high, causing the memory cell 125 to operate under the low voltage mode. Accordingly, respective pulse widths of the read WL signal and write WL signal in the second clock cycle 1220 and third clock cycle 1230 are widen, when compared to the pulse widths of the read WL signal and write WL signal in the first clock cycle 1210.

Figure 13:
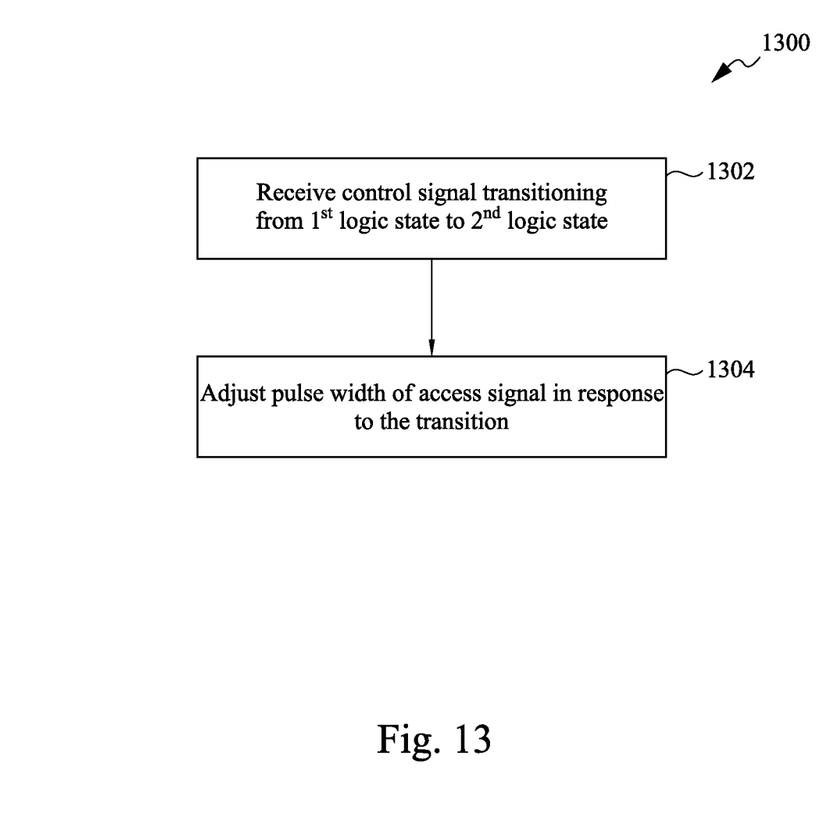
FIG. 13 is an example flow chart of a method for operating a memory system of FIG. 1, in accordance with some embodiments.

FIG. 13 illustrates a flow chart of an example method 1300 for operating a memory system or circuit, in accordance with various embodiments. The method 1300 may be used to operate a memory system that can be configured in a plural number of operation modes, each of which may be associated with respectively different read/write margins through adjustment of the corresponding WL pulse widths. For example, at least some of the operations described in the method 1300 can operate the memory system 100 (FIG. 1). It is noted that the method 1300 is merely an example and is not intended to limit the present disclosure. Accordingly, it is understood that additional operations may be provided before, during, and after the method 1300 of FIG. 13, and that some other operations may only be briefly described herein.

The method 1300 starts with operation 1302 in which a control signal that transitions from a first logic state to a second logic state within a single clock cycle is received. In some embodiments, the clock cycle contains a first phase and a second phase. The first phase and second phase may correspond to the read operation and the write operation of an operatively coupled memory cell, respectively. Using the memory system 100 (FIG. 1), in conjunction with the waveforms (FIG. 2), as a representative example, the memory system 100 can receive the TURBO control signal through one of its input/output pins. A logic state of the TURBO control signal can be utilized by the memory system 100 to determine whether to adjust the pulse width of an access signal controlling the access of a memory cell of the memory system 100 (e.g., memory cell 125, which may be an SRAM cell).

In various embodiments, the TURBO control signal may be asserted (e.g., to logic high), when the memory system 100 is desired to achieve a higher maximum operating frequency (Fmax), powered with a higher supply voltage (VDD), and/or can tolerate a smaller read/write margin; and the TURBO control signal may be deasserted (e.g., to logic low), when the memory system 100 is not required to achieve a higher maximum operating frequency (Fmax), powered with a lower supply voltage (VDD), and/or cannot tolerate a smaller read/write margin.

Next, the method 1300 proceeds to operation 1304 in which the pulse width of an access signal that is configured to control the access of a memory cell is adjusted, in response to the transition of the control signal. In various embodiments of the present disclosure, the access signal may be a WL signal that controls the access of a memory cell. In the example where the memory cell is an SRAM cell, the WL signal can gate (e.g., turn on/off) access transistors of the SRAM cell. For example, when the WL signal is asserted to logic high, the SRAM cell is allowed (or turned on) to be read or written. Accordingly, the WL signal may include at least two pulses, one of which is configured for the read operation (e.g., a read WL pulse) and the other of which is configured for the write operation (e.g., a write WL pulse).

Continuing with the above example, when the TURBO control signal transitions from logic low to logic high, the memory system 100 may acknowledge such an transition, causing the timing controller 110 to shorten the corresponding read and/or write WL pulse. When the TURBO control signal transitions from logic high to logic low, the memory system 100 may acknowledge such an transition, causing the timing controller 110 to widen the corresponding read and/or write WL pulse. In one embodiment, the TURBO control signal can transition between logic high and logic low prior to the first phase and second phase. In another embodiment, the TURBO control signal can transition between logic high and logic low between the first phase and second phase. In yet another embodiment, the TURBO control signal can transition between logic high and logic low subsequently to the first phase and second phase.

In one aspect of the present disclosure, a circuit is disclosed. The circuit includes an array including a plurality of memory cells; a driver operatively coupled to the array and configured to provide an access signal controlling an access to one or more of the plurality of memory cells; and a timing controller operatively coupled to the driver. The timing controller is configured to: receive a control signal; and in response to the control signal transitioning from a first logic state to a second logic state, adjust a pulse width of the access signal within a single clock cycle containing a first phase and a second phase, wherein the first phase includes reading a first data bit stored in a first one of the one or more memory cells and the second phase includes writing a second data bit into the first memory cell.

In another aspect of the present disclosure, a circuit is disclosed. The circuit includes an array including a plurality of memory cells; a driver operatively coupled to the array and configured to provide an access signal controlling an access to one or more of the plurality of memory cells; and a timing controller operatively coupled to the driver and configured to adjust a pulse width of the access signal based on a logic state of a control signal. The plurality of memory cells are configured to operate under a first mode when the control signal is provided at a first logic state, and under a second mode when the control signal is provided at a second logic state. The first mode is associated with a first read margin and a first write margin configured for the plurality of memory cells, and the second mode is associated with a second read margin and a second write margin configured for the plurality of memory cells. The first read margin is substantially higher than the second read margin, and the first write margin is substantially higher than the second write margin.

In yet another aspect of the present disclosure, a method for operating a memory circuit is disclosed. The method includes receiving a control signal that transitions from a first logic state to a second logic state within a single clock cycle, wherein the clock cycle contains a first phase and a second phase; and in response to the transition of the control signal, adjusting a pulse width of an access signal that is configured to control an access of a memory cell. The first phase includes reading a first data bit stored in the memory cell and the second phase includes writing a second data bit into the memory cell.

As used herein, the terms "about" and "approximately" generally indicates the value of a given quantity that can vary based on a particular technology node associated with the subject semiconductor device. Based on the particular technology node, the term "about" can indicate a value of a given quantity that varies within, for example, 10-30% of the value (e.g., +10%, +20%, or +30% of the value).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
an array including a plurality of memory cells;
a driver operatively coupled to the array and configured to provide an access signal controlling an access to one or more of the plurality of memory cells; and
a timing controller operatively coupled to the driver and configured to:
receive a control signal; and
in response to the control signal transitioning from a first logic state to a second logic state, adjust a pulse width of the access signal within a single clock cycle containing a first phase and a second phase, wherein the first phase includes reading a first data bit stored in a first one of the plurality of memory cells and the second phase includes writing a second data bit into the first one of the plurality of memory cells.

2. The circuit of claim 1, further comprising an input/output pin configured to receive the control signal.

3. The circuit of claim 1, wherein when the control signal is at the first logic state, the plurality of memory cells are configured to operate under a first mode, and when the control signal is at the second logic state, the plurality of memory cells are configured to operate under a second mode.

4. The circuit of claim 3, wherein, in the first mode, the plurality of memory cells receive a supply voltage at a first level, and, in the second mode, the plurality of memory cells receive the supply voltage at a second level, and wherein the second level is substantially higher than the first level.

5. The circuit of claim 3, wherein, in the first mode, the plurality of memory cells receive a clock signal with a first frequency, and, in the second mode, the plurality of memory cells receive the clock signal with a second frequency, and wherein the second frequency is substantially higher than the first frequency.

6. The circuit of claim 1, wherein in response to the control signal transitioning from the first logic state to the second logic state, the timing controller is further configured to shorten the pulse width of the access signal within the single clock cycle.

7. The circuit of claim 1, wherein the pulse width of the access signal is shortened during at least one of the first phase or the second phase.

8. The circuit of claim 1, wherein the timing controller comprises:
one or more first transistors gated by the control signal; and
one or more second transistors gated by the control signal.

9. The circuit of claim 8, wherein the one or more first transistors, when activated, are configured to shorten the pulse width of the access signal during the first phase.

10. The circuit of claim 8, wherein the one or more second transistors, when activated, are configured to shorten the pulse width of the access signal during the second phase.

11. The circuit of claim 1, wherein the plurality of memory cells each include a Static Random Access Memory (SRAM) bit cell.

12. A circuit, comprising:
an array including a plurality of memory cells;
a driver operatively coupled to the array and configured to provide an access signal controlling an access to one or more of the plurality of memory cells; and
a timing controller operatively coupled to the driver and configured to adjust a pulse width of the access signal based on a logic state of a control signal;
wherein the plurality of memory cells are configured to operate under a first mode when the control signal is provided at a first logic state, and under a second mode when the control signal is provided at a second logic state;
wherein the first mode is associated with a first read margin and a first write margin configured for the plurality of memory cells, and the second mode is associated with a second read margin and a second write margin configured for the plurality of memory cells; and
wherein the first read margin is substantially higher than the second read margin, and the first write margin is substantially higher than the second write margin.

13. The circuit of claim 12, further comprising an input/output pin configured to receive the control signal.

14. The circuit of claim 12, wherein the plurality of memory cells each include a Static Random Access Memory (SRAM) bit cell.

15. The circuit of claim 12, wherein the pulse width of the access signal is adjusted to be shorter in the second mode than in the first mode.

16. The circuit of claim 12, wherein the logic state of the control signal transitions from the first logic state to the second logic state within a single clock cycle.

17. The circuit of claim 16, wherein the plurality of memory cells are configured to operate under the first mode and the second mode during a first phase and a second phase within the single clock cycle, respectively.

18. A method for operating a memory circuit, comprising:
receiving a control signal that transitions from a first logic state to a second logic state within a single clock cycle, wherein the single clock cycle contains a first phase and a second phase; and
in response to the transition of the control signal, adjusting a pulse width of an access signal that is configured to control an access of a memory cell;
wherein the first phase includes reading a first data bit stored in the memory cell and the second phase includes writing a second data bit into the memory cell.

19. The method of claim 18, wherein the control signal is received through an input/output pin of a Static Random Access Memory (SRAM) circuit.

20. The method of claim 18, wherein the control signal transitions from the first logic state to the second logic state prior to the first phase and the second phase, between the first phase and the second phase, or subsequently to the first phase and the second phase.

* * * * *